US006830476B2

(12) United States Patent
Gesuita et al.

(10) Patent No.: US 6,830,476 B2
(45) Date of Patent: Dec. 14, 2004

(54) ELECTRIC POWER AND COMMUNICATIONS SIGNAL DISTRIBUTION UNIT, PARTICULARLY FOR HEADS OF COMBINATION WEIGHERS

(75) Inventors: Enzo Gesuita, Selvazzano Dentro (IT); Francesco Gusson, Vigonza (IT)

(73) Assignee: Martini S.r.l., Galliera Veneta (IT)

( * ) Notice: Subject to any disclaimer, the term of this patent is extended or adjusted under 35 U.S.C. 154(b) by 18 days.

(21) Appl. No.: 10/600,427

(22) Filed: Jun. 23, 2003

(65) Prior Publication Data

US 2004/0058564 A1 Mar. 25, 2004

(30) Foreign Application Priority Data

Sep. 20, 2002 (IT) ...................................... PD2002A0239

(51) Int. Cl.[7] ........................ H01R 12/24; G01G 13/00
(52) U.S. Cl. .................................... 439/498; 177/25.18
(58) Field of Search ................................ 439/498, 492, 439/493; 177/25.18

(56) References Cited

U.S. PATENT DOCUMENTS

| | | | | |
|---|---|---|---|---|
| 5,981,881 A | * | 11/1999 | Kawanishi et al. | ...... 177/25.18 |
| 6,046,411 A | * | 4/2000 | Kawanishi et al. | ...... 177/25.13 |
| 6,373,001 B1 | * | 4/2002 | Kono et al. | ............... 177/25.18 |
| 6,408,223 B1 | * | 6/2002 | Skyum et al. | ............... 700/213 |
| 6,462,287 B1 | * | 10/2002 | Mikesell | ................... 177/25.18 |
| 6,545,230 B2 | * | 4/2003 | Tamai et al. | .............. 177/25.18 |
| 6,566,613 B1 | * | 5/2003 | Gesuita et al. | ............ 177/25.18 |
| 6,720,503 B2 | * | 4/2004 | Schmidhuber | ............ 177/25.18 |

* cited by examiner

Primary Examiner—Gary Paumen
(74) Attorney, Agent, or Firm—Guido Modiano; Albert Josif; Daniel O'Byrne

(57) ABSTRACT

A distribution unit for electric power and communications signals, particularly adapted to be used in combination weighers in order to supply power to individual heads of the weigher; the distribution unit is composed of a flexible printed circuit, which is manufactured flat and is provided with a plurality of multipole connectors for supplying power to the heads of a combination weigher and connect them to the communications network; the printed circuit is mounted on a substantially cylindrical structure, so that the multipole connectors are each arranged along a generatrix of the cylinder and the connectors of the weighing heads can be coupled to them radially.

11 Claims, 4 Drawing Sheets

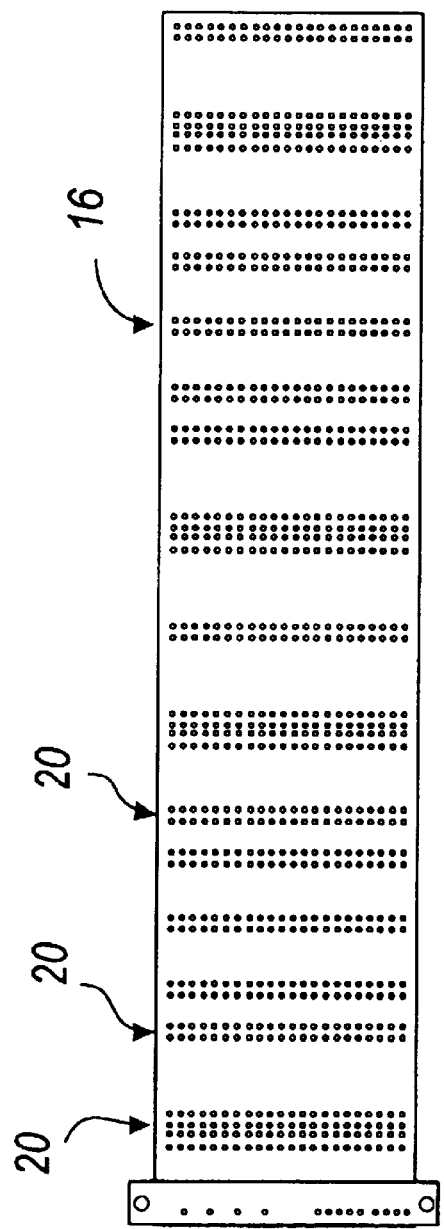
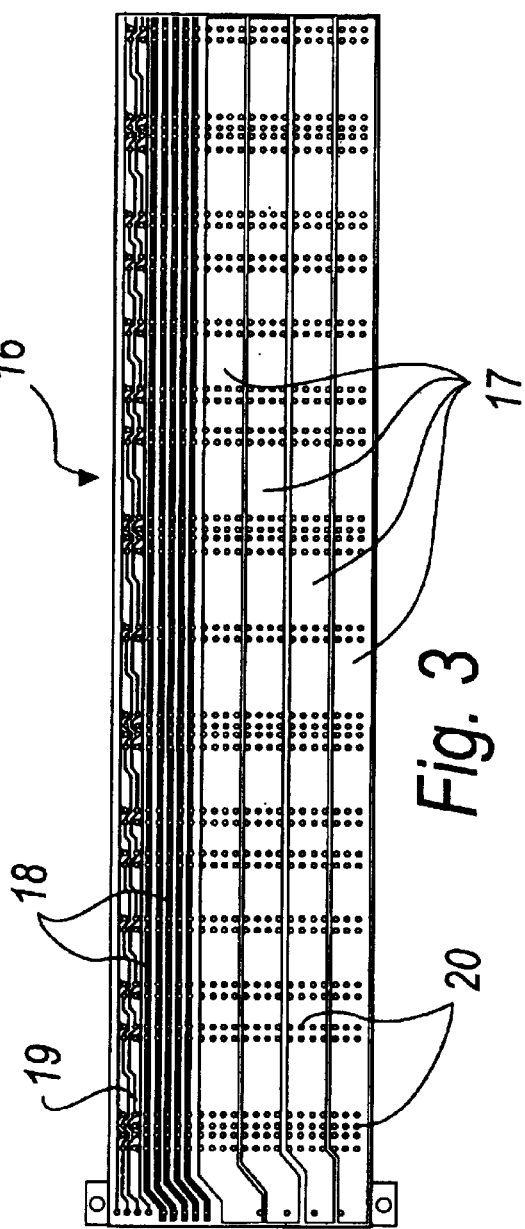

ELECTRIC POWER AND COMMUNICATIONS SIGNAL DISTRIBUTION UNIT, PARTICULARLY FOR HEADS OF COMBINATION WEIGHERS

BACKGROUND OF THE INVENTION

The present invention relates to an electric power and communications signal distribution unit, particularly suitable to be used in combination weighers to connect and power the individual heads.

The combination weighers to which the invention relates are constituted by a plurality of independent weighing stations, known as heads, which are connected to a so-called central control unit, constituted by a PC or the like, by way of a communications network.

Each head, with reference to its mechanical structure, has its own vibrating channel, a loading bucket, a weighing bucket coupled to a load cell or the like and an optional memory bucket.

The vibrating channel is normally actuated by an electromagnet, while the buckets are provided with shutters moved by step motors.

In a typical embodiment of a combination weighing system, the heads are arranged in a circular configuration, so that the product to be weighed can slide radially from the center, where there is an upper cone, toward the heads and then from these heads toward a transfer device, for example a cone or funnel, which conveys the weighed product toward a packaging system.

The methods most widely used to control the electromechanical and electronic components of the heads of a combination weighing system are essentially two.

According to a first method, also known as functional approach, a plurality of control units (electronic boards) are provided, each being designed to manage a specific function (for example control of all the motors, control of all the electromagnets, et cetera).

This method has several drawbacks.

First of all, a fault of a single board compromises the operation of the entire weigher, since it compromises the management of the components that the board controls and drives.

In each head, which is identical to all the others, there is one of these components, and therefore the operation of all the heads is compromised.

Moreover, it is necessary to lead cables from each control unit in order to wire the controlled component in each head.

This entails a very complex wiring, which must be performed by highly specialized personnel in order to avoid incorrect connections.

The second known method, known as modular approach, entails that each head is provided with a control unit (an electronic board that manages only the electromechanical and electronic components of the head being considered).

This method is certainly better than the functional approach method.

First of all, it allows to have heads that are totally independent from the standpoint of power supply and control, thus simplifying construction and achieving the advantage that a fault of a single board compromises the operation of a single head, while all the other heads can continue to operate without problems.

The modular approach method also allows to provide more efficient wiring inside the machine.

The heads become true electromechanical modules, which are powered by a single electrical power supply system and are driven by the central control unit over the communications network.

In this case, the number of wires is reduced considerably with respect to the case of the functional approach, and construction, technical support and maintenance of the system are thus simplified.

Even in the case of the modular approach, however, there are problems in the electrical wiring for supplying power to the electronic boards of each head starting from the transformers located inside the machine and for creating a communications network between the boards and the central control unit.

The problem, according to the background art, has been solved partially by central-symmetry distribution systems, designed to supply power to the heads and allow them to communicate with the central control unit.

These structures have a cylindrical shape or are monolithic prisms that have as many faces as there are weigher heads to be served.

Considering schematically the body of a combination weigher as a metal cylinder with lateral openings in which the weighing heads are inserted, these distribution systems are placed at the center of the cylinder.

Their structure is based on a plurality of self-centering connectors, which are mounted vertically on the faces of the distribution prism and allow engagement with the heads when the heads are inserted radially in the body of the weigher.

The heads of the weigher must be provided with self-centering connectors that are complementary to the connectors of the distribution system.

The disadvantages of these structures are first of all related to the high cost that arises from the use of special self-centering connectors and most of all from the difficulty of assembling and wiring these connectors to the entire system.

The wiring requires complex assembly procedures and still requires the manual skill of expert operators, but despite this the connections can be unreliable and difficult to maintain indeed because they are structurally complicated.

SUMMARY OF THE INVENTION

The aim of the present invention is to overcome the problems of known distribution units by providing a distribution unit that in particular is easy to manufacture.

Within this aim, an object of the invention is to provide a distribution unit that substantially eliminates wiring problems.

Another object is to provide a distribution unit in which the remaining wiring can be provided even by a person who is not particularly specialized.

Another object is to provide a distribution unit that uses low-cost components.

Another object is to provide a distribution unit in which maintenance operations are simplified.

This aim and these and other objects that will become better apparent hereinafter are achieved by a distribution unit for electric power and communications signals, particularly for heads of combination weighers, characterized in that it comprises a flexible printed circuit provided with a plurality of multipole connectors, at least one for each head of the machine, said flexible circuit being mounted on a substantially cylindrical supporting structure arranged at a center of a combination weigher, said circuit carrying, by means of a plurality of electrically conducting tracks, an electric power supply and electronic communications to complementary multipole connectors provided in electronic boards of all weighing heads.

BRIEF DESCRIPTION OF THE DRAWINGS

Further characteristics and advantages of the invention will become better apparent from the following detailed description of a preferred embodiment thereof, illustrated by way of non-limitative example in the accompanying drawings, wherein:

FIG. 2 is a view of the first face of the printed circuit, still flat before it is mounted on the cylindrical support;

FIG. 3 is a view of the second face of the printed circuit of FIG. 2;

DESCRIPTION OF THE PREFERRED EMBODIMENTS

Figure 1:
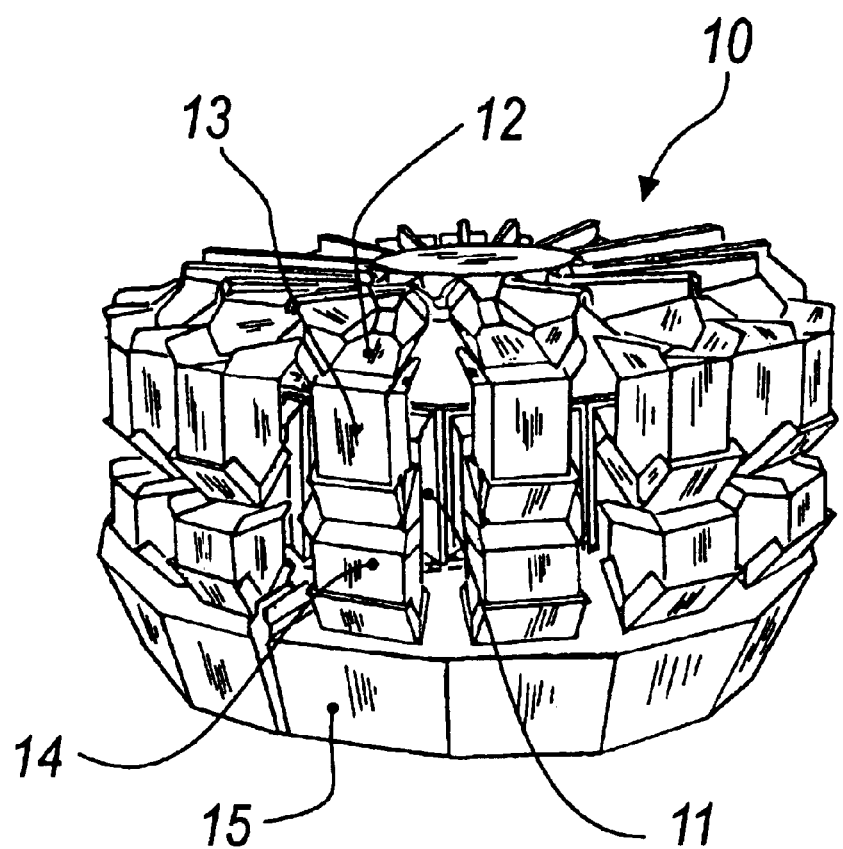
FIG. 1 is a perspective view of a typical combination weigher.

With reference to the figures, in FIG. 1 the reference numeral 10 generally designates a combination weigher provided with a plurality of weighing heads, one of which is designated by the reference numeral 11.

As can be seen, the weighing heads are arranged radially with respect to the central core of the machine, and each head has, in its upper part, a radial vibrating channel 12 that is superimposed on a loading bucket 13 and on a weighing bucket 14, which in turn is superimposed on a conveyor 15 that conveys the dosed material to a packaging station, not shown.

FIGS. 2 and 3 illustrate a flexible printed circuit, generally designated by the reference numeral 16, and highlight first tracks 17, second tracks 18 and third tracks 19 thereof, all of which conduct electricity and have various shapes and widths calculated so that they can carry high- or low-intensity currents, depending on whether they are intended for high- or low-consumption user devices or for carrying electronic communications signals.

The printed circuit is produced flat, with ordinary technologies for the manufacture of printed circuits, with the only exception that the material of which it is made is not rigid but is flexible.

At preset intervals, rows of holes 20 are provided on the printed circuit and allow the insertion and soldering of terminals of multipole connectors 22 shown in the figures that follow.

At the rows of holes 20, the printed circuit can be stiffened by gluing perforated vetronite inserts, which improve the mechanical coupling between the printed circuit and the multipole connectors and allow easier, and therefore more reliable, soldering of the terminals of the connectors.

The printed circuit is provided with several rows of holes 20, which form separate pluralities that allow to use the same printed circuit in machines that have a different number of weighing stations.

Clearly, this is not a necessary fact, but has been studied simply in order to reduce the number of systems required to provide the printed circuits, so that each one adapts to different types of weigher.

FIGS. 4 to 7 show the printed circuit 16 mounted on a cylindrical supporting structure 21, which is in turn installed in the axial central region of the weigher.

The structure 21 is constituted by a sturdy metallic drum, on which the multipole connectors, designated by the reference numeral 22, are associated in an upper region and in a lower region, for example by way of screws, and are thus arranged, after their terminals have been already welded to the printed circuit, along vertical generatrices of the cylindrical supporting structure 21.

Connectors 23 for supplying power to the tracks are associated with the printed circuit 16, at one end thereof when it is provided flat.

The connectors 23 are the only ones that have to be wired in the machine, while the rest of the wiring is provided simply by associating the multiple connectors 22 with the printed circuit.

Figure 4:
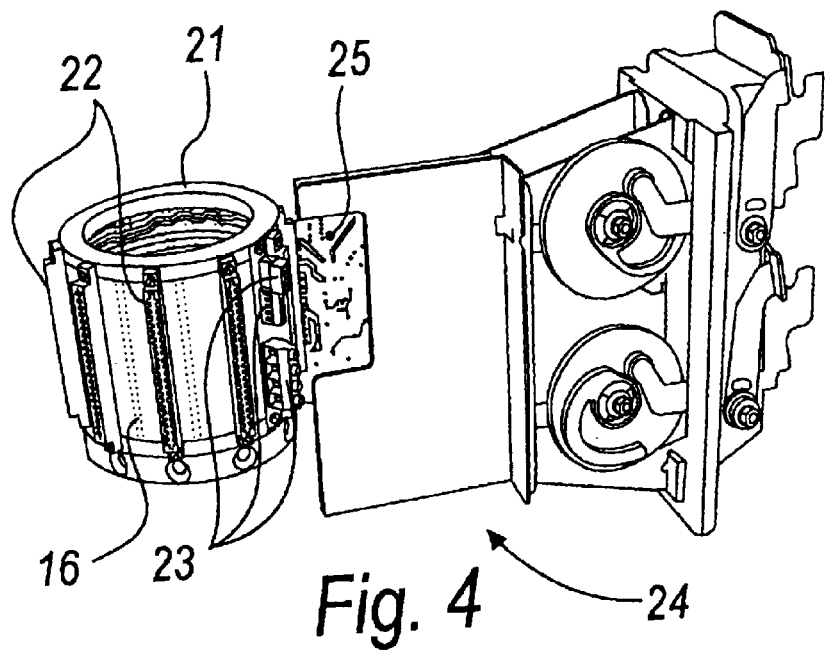
FIG. 4 is a perspective view of the printed circuit mounted on a cylindrical support and illustrates its connection to an electronic board of one of the weighing heads.
Figure 5:
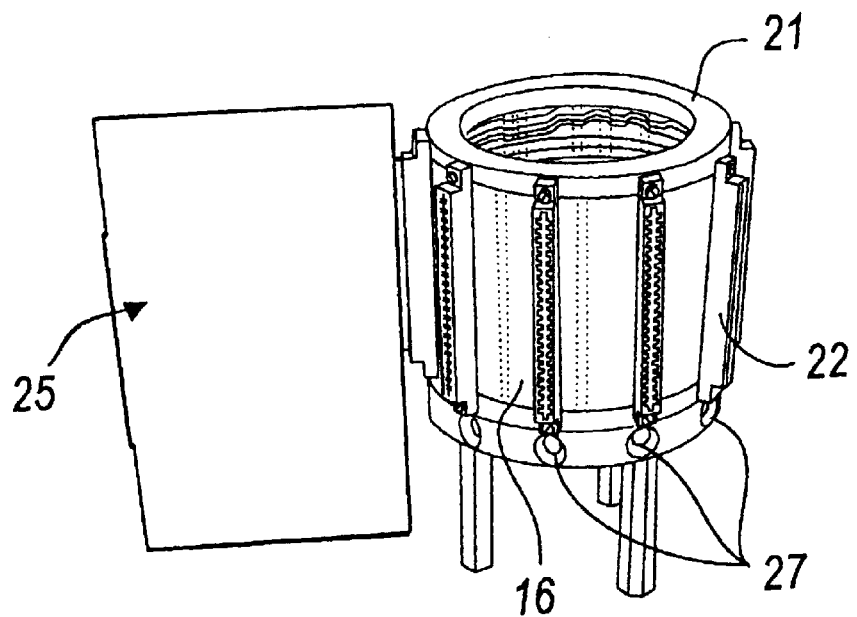
FIG. 5 is a second perspective view of the printed circuit mounted on the cylindrical structure and connected to the electronic board of one of the weighing heads.
Figure 6:
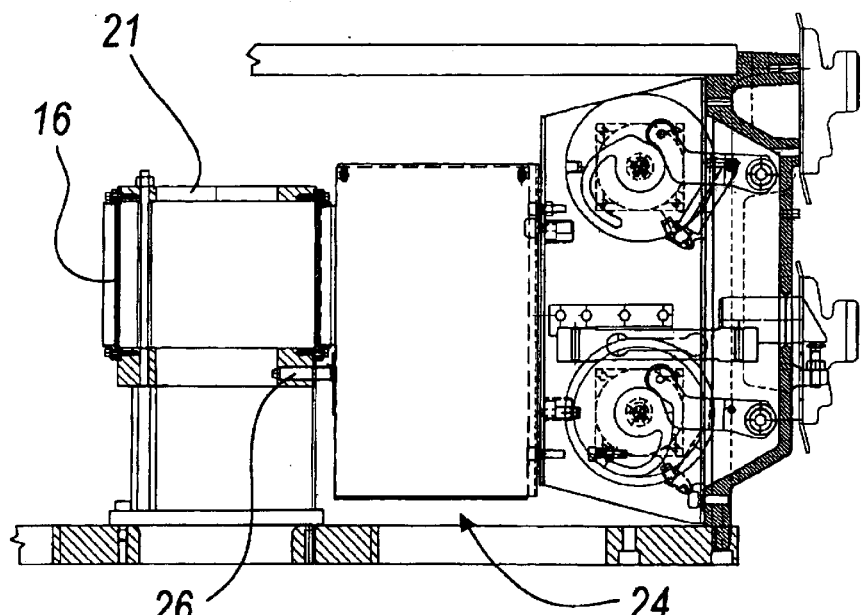
FIG. 6 is a schematic side view of the coupling between the distribution unit and one of the heads of the machine.
Figure 7:
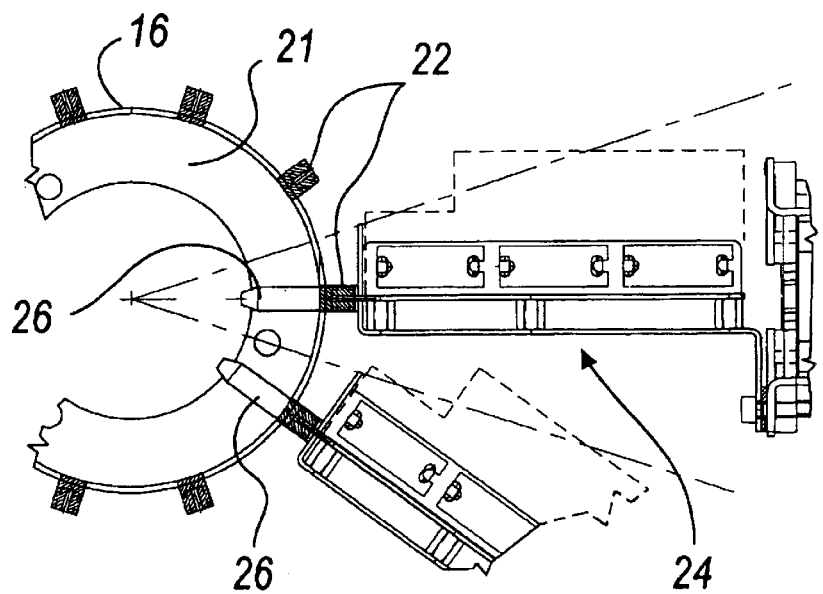
FIG. 7 is a top view of the distribution unit connected to the electronic board of one of the weighing heads.

The connection portion of an electronic board 25 is fitted on each one of the multiple connectors 22 and, as shown in FIG. 4, said board is fixed to a metallic support 24, which is rigidly coupled to a weighing head.

The connection of the electronic board 25 occurs simply by inserting its region provided with contacts in the corresponding multiple connector 22.

In order to facilitate the insertion of the board in the connector 22, the metallic support 24 of the board 25 is provided with a centering pin 26, which enters a centering hole 27 provided in the cylindrical supporting structure 21 at a connector 22.

If one requires greater safety, it is possible to provide more than one centering pin 26 and therefore a plurality of holes 27 at said pins.

The centering pin 26 is conical at the front, and so is the first portion of the hole 27.

Once insertion has occurred, the pin 26 enters the hole 27 perfectly, allowing only radial movements of the electronic board, so that there are no abnormal loads on the connector 22 or on the complementary connector of the board 25.

From what has been described and illustrated above, it is evident that the intended aim and objects have all been achieved.

In particular, attention is called to the considerable cost reduction that arises from the use of the flexible printed circuit, which when assembled flat by way of automatic processes becomes in practice the means for wiring the entire system.

It is evident that with this embodiment the wiring technician does not have to perform any operation other than simply connecting the small number of electric wires that supply power to the tracks of the electronic circuit.

In addition to this, it is possible to use multipole connectors that have a lower cost than the self-centering connectors used up to now.

For these reasons, the materials and the dimensions may be any.

The disclosures in Italian Patent Application No. PD2002A000239 from which this application claims priority are incorporated herein by reference.

What is claimed is:

1. A distribution unit for electric power and communications signals, particularly for heads of combination weighers, comprising a flexible printed circuit provided with a plurality of multipole connectors, at least one for each head, said flexible circuit being mounted on a substantially cylindrical supporting structure arranged at a center of a combination weigher, said circuit carrying, by means of a plurality of electrically conducting tracks, an electric power supply and electronic communications, said multipole connectors finding continuity in complementary connectors provided in an electronic board located in each weighing head.

2. The distribution unit according to claim 1, wherein said flexible printed circuit is formed flat and has a plurality of electrically conducting tracks, which have different dimensions depending on whether they are designed to carry medium or medium-high currents for medium or medium-high power user devices and have a small cross-section for electronic communications.

3. The distribution unit according to claim 1, further comprising, with one or more different pitches, a plurality of holes that are adapted to allow insertion of terminals of the multiple connectors in order to perform soldering in pre-defined positions in particular in relation to the number of heads of the combination weigher for which the distribution unit is intended.

4. The distribution unit according to claim 1, further comprising power supply connectors in order to facilitate wiring to the electrical system of the combination weigher.

5. The distribution unit according to claim 1, wherein said flexible printed circuit is monolithically coupled to a substantially cylindrical or prism-like structure, to which said multipole connectors are also fixed.

6. The distribution unit according to claim 1, wherein the electronic boards of each head are inserted in said multipole connectors in the region where there is a comb of electrical contacts.

7. The distribution unit according to claim 1, wherein said substantially cylindrical supporting structure has, at each one of said multiple connectors, at least one hole in which a pin is inserted for centering reasons, said pin being rigidly coupled to a metallic support that supports the electronic board and is associated with a weighing head.

8. The distribution unit according to claim 7, wherein said centering pin has a conical end and said centering hole has a flared insertion region.

9. The distribution unit according to claim 7, further comprising a plurality of centering holes and pins.

10. The distribution unit according to claim 1, wherein said flexible printed circuit has tracks for carrying the electric distribution alone to the boards of the heads.

11. The distribution unit according to claim 1, wherein said flexible printed circuit has tracks for carrying to the boards only the communications network or other signals of the analog or digital type.

* * * * *